(12) United States Patent
Bunce et al.

(10) Patent No.: US 6,584,023 B1
(45) Date of Patent: Jun. 24, 2003

(54) SYSTEM FOR IMPLEMENTING A COLUMN REDUNDANCY SCHEME FOR ARRAYS WITH CONTROLS THAT SPAN MULTIPLE DATA BITS

(75) Inventors: Paul A. Bunce, Poughkeepsie, NY (US); John D. Davis, Maybrook, NY (US); Thomas J. Knips, Wappingers Falls, NY (US); Donald W. Plass, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/043,024

(22) Filed: Jan. 9, 2002

(51) Int. Cl.$^7$ ................................................ G11C 7/00
(52) U.S. Cl. ................................... 365/200; 365/189.02
(58) Field of Search ........................... 365/200, 189.02, 365/230.02

(56) References Cited

U.S. PATENT DOCUMENTS 5,675,543 A * 10/1997 Rieger .......................... 365/200
6,366,508 B1 * 4/2002 Agrawal et al. ........ 365/189.02
6,507,524 B1 * 1/2003 Agrawal et al. ........ 365/230.02

\* cited by examiner

*Primary Examiner*—Huan Hoang
(74) *Attorney, Agent, or Firm*—Lynn Augspurger; Cantor Colburn LLP

(57) ABSTRACT

An exemplary embodiment of the present invention is a system for implementing a column redundancy scheme for arrays with controls that span multiple data bits. The system includes an array of data bits for receiving data inputs, a spare data bit and a field control input line. Also included in the system is circuitry to separate a field control signal from the field control input line into one or more individual control signals for activating a corresponding data bit in the array or for input to a multiplexor. The system further comprises circuitry to steer around a defective data bit in the array. This circuitry includes: a field control signal multiplexor corresponding to each field control signal; a spare control signal multiplexor to activate the spare data bit; a data multiplexor corresponding to each of the data bits in the array; and a spare data multiplexor to steer one of the data inputs to the spare data bit. The system also includes programmable logic in communication with the field control signal multiplexor, the spare control signal multiplexor, the data multiplexor and the spare data multiplexor to cause the steer around to take place in response to detecting a defective data bit in the array.

9 Claims, 4 Drawing Sheets

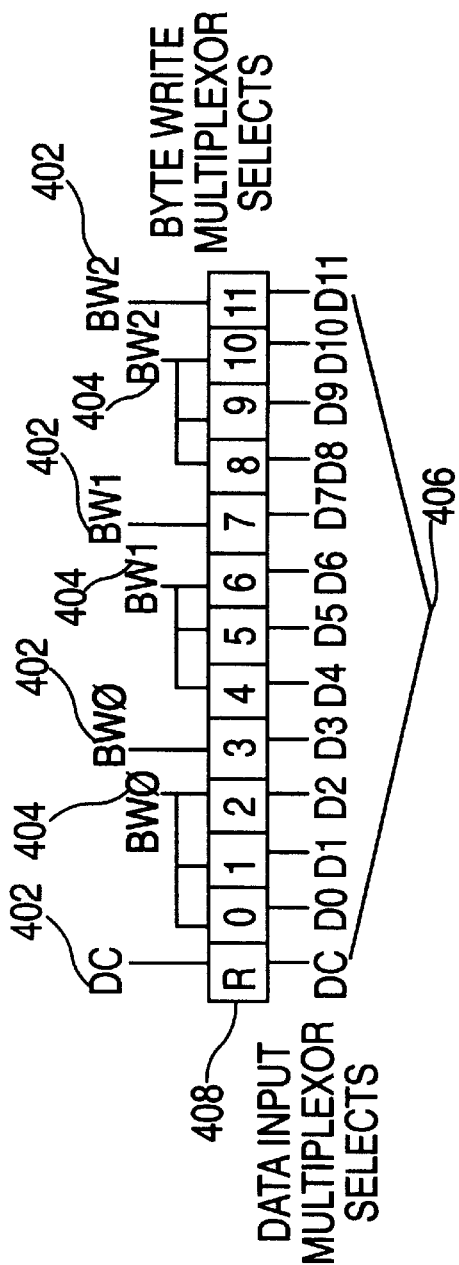
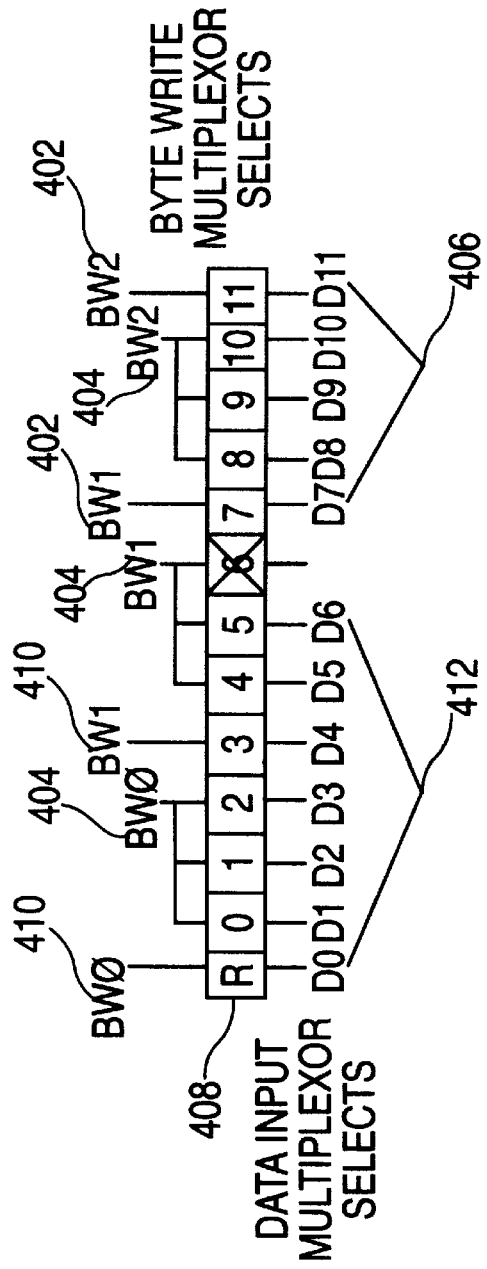

SYSTEM FOR IMPLEMENTING A COLUMN REDUNDANCY SCHEME FOR ARRAYS WITH CONTROLS THAT SPAN MULTIPLE DATA BITS

FIELD OF THE INVENTION

The present invention relates generally to computer arrays, and more particularly to an improved system for implementing a column redundancy scheme for arrays with controls that span multiple data bits.

BACKGROUND OF THE INVENTION

The ability to provide a work around for errors discovered during the testing of integrated circuits can result in fewer integrated circuits being scrapped due to a single faulty data bit. The cost of adding memory and circuitry to every integrated circuit is balanced against the cost of scrapping an entire integrated circuit because of a faulty data bit. The cost of added circuitry may be relatively minor when dealing with control signals that are contained in a single data bit because only one redundant data bit may be required to provide a backup storage location. However, the cost of added circuitry increases with control signals that span more than one data bit. The data bits spanned by a control signal, referred to as a field, require that an extra or redundant field be added to the circuitry to provide a backup storage location. As the size of the field increases, the cost of the added circuitry increases.

An example of a control signal that could span multiple data bits is the byte write ("BW") control signal that may be associated with Static Random Access Memory (SRAM). Using an example where the BW control signal field length is four, providing a backup storage location would require that a redundant field containing four data bits be added to the circuitry on the integrated circuit. If an error is detected in one of the four data bits in a data field specified by the BW control signal during testing of the integrated circuit, entire fields would be shifted to correct for the defective data bit. This steering is implemented for both input and output signals in order to bypass a defective bit. Typically, this occurs by shifting fields to prior fields and by shifting the first field to the redundant field. The fields stored after the failing data bit are not shifted. For example, if an array contains six fields and field four contains a faulty data bit, then field one would be moved into the redundant field, field two into field one, field three into field two, and field four into field three. Fields five and six would remain unaffected. The shifting occurs by changing the input to the field selection multiplexors on the integrated circuit.

Providing a redundant data field for error recovery during system test can require significant overhead in terms of space for extra circuitry. The amount of overhead varies based on the field length. In addition, the fields must be the same length so that they can be shifted when an error is detected.

SUMMARY OF THE INVENTION

An exemplary embodiment of the present invention is a system for implementing a column redundancy scheme for arrays with controls that span multiple data bits. The system includes an array of data bits for receiving data inputs, a spare data bit and a field control input line. Also included in the system is circuitry to separate a field control signal from the field control input line into one or more individual control signals for activating a corresponding data bit in the array or for input to a multiplexor. The system further comprises circuitry to steer around a defective data bit in the array. This circuitry includes: a field control signal multiplexor corresponding to each field control signal; a spare control signal multiplexor to activate the spare data bit; a data multiplexor corresponding to each of the data bits in the array; and a spare data multiplexor to steer one of the data inputs to the spare data bit. The system also includes programmable logic in communication with the field control signal multiplexor, the spare control signal multiplexor, the data multiplexor and the spare data multiplexor to cause the steer around to take place in response to detecting a defective data bit in the array.

DESCRIPTION OF THE DRAWINGS

Referring now to the figures wherein the like elements are numbered alike.

FIG. 4a is a block diagram depicting an exemplary circuit and input values defective data bit has been detected.

FIG. 4b is a block diagram depicting an exemplary circuit and input values defective data bit has been detected and steered around.

DETAILED DESCRIPTION OF THE INVENTION

Figure 1:
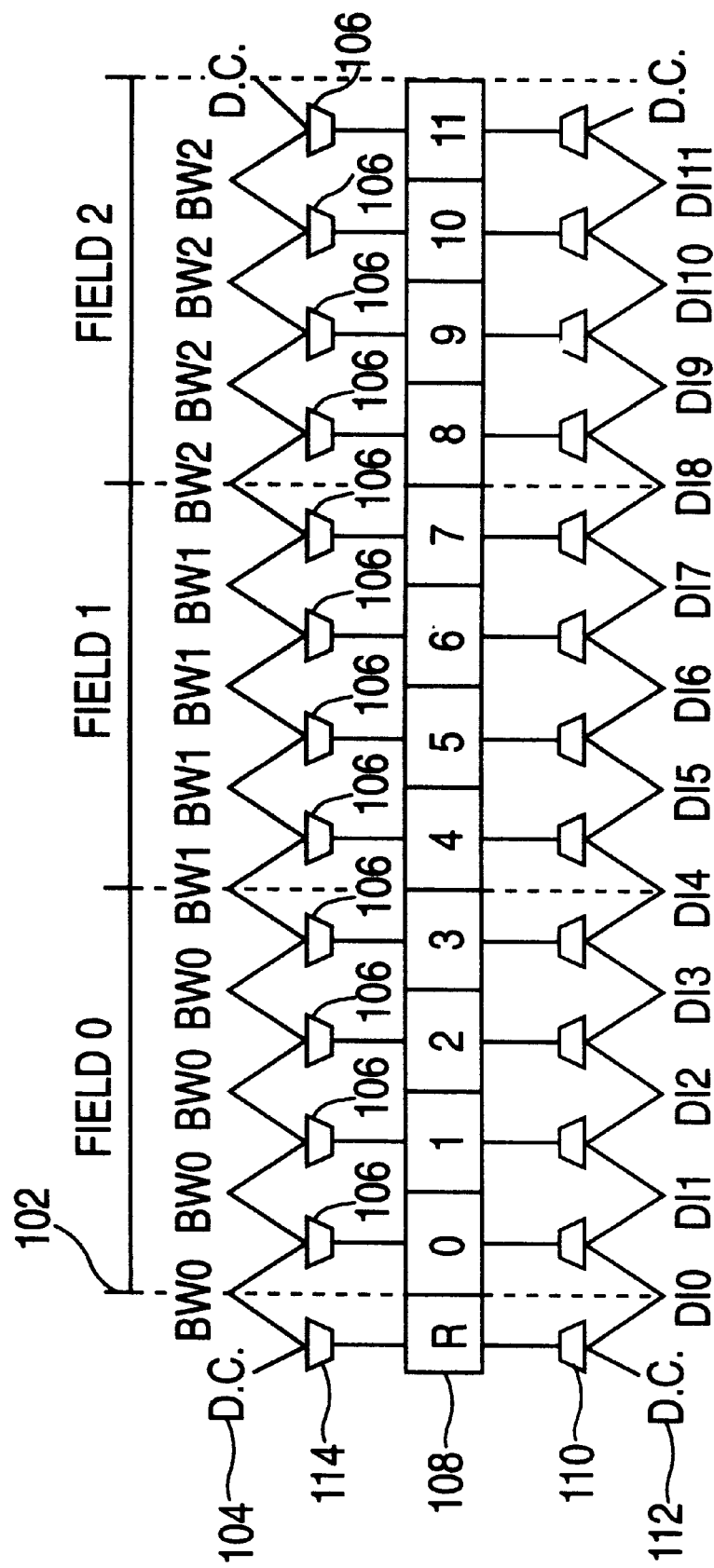
FIG. 1 depicts an exemplary embodiment of the circuitry of the present invention.

An exemplary embodiment of the present invention is a system (e.g. an integrated circuit) that implements a column redundancy scheme for arrays with controls that span multiple data bits. FIG. 1 depicts an exemplary embodiment of the present invention using a byte write (BW) control signal as an example of a control signal that spans more than one data bit. The fields 102, or collection of data bits controlled by a multi-bit field control signal, are listed across the top of FIG. 1 and include "Field 0", "Field 1" and "Field 2." The field length, four in this example, is equal to the number of bits controlled by each BW multi-bit field control signal. Each BW multi-bit field control signal is broken down into an individual BW control signal (BW0, BW1, BW2) 104 corresponding to each data bit in the field. The "D.C." control signal input 104 into the first and last multiplexor 106 is a constant control signal that is tied to a known voltage, a logic zero or logic one. In this exemplary embodiment, because the field length is four, each BW multi-bit field control signal is broken down into four individual BW data bit control signals 104. The control signals 104, both individual BW data bit control signals and D.C. control signals are input to field control signal multiplexors 106 and to a spare control signal multiplexor 114 in order to determine which bits or columns in the array of data bits 108 should be activated. FIG. 1 also depicts data multiplexors 110 corresponding to each data bit in the array of data bits 108 along with data input values 112 going in to the data multiplexors 110. The "D.C." input signal 112 is a constant data signal that is tied to a known voltage, a logic zero or logic one. The data multiplexors 110 are used to select which data input value (D.C., DI0, DI1, . . . DI11, D.C.) 112 will go into each bit or column in the array of data bits 108. This exemplary embodiment can be expanded to any number of fields, to fields of any length, and to control signals that span multiple data bits. The present invention can be applied to both input and output signals in order to bypass a defective bit. In addition, this embodiment can be expanded to circuit elements including arrays containing logic combinations.

In this embodiment, only one data bit, denoted as "R" in the array of data bits 108, is added as a spare data bit to be used if needed to steer around a defective data bit. If a defective data bit is detected during testing, the multiplexor selectors are reset to utilize the spare data bit and to steer around or skip the defective bit. The original circuitry inputs and the circuitry inputs resulting from steering around a defective bit are described in reference to FIG. 4a and FIG. 4b.

Figure 2:
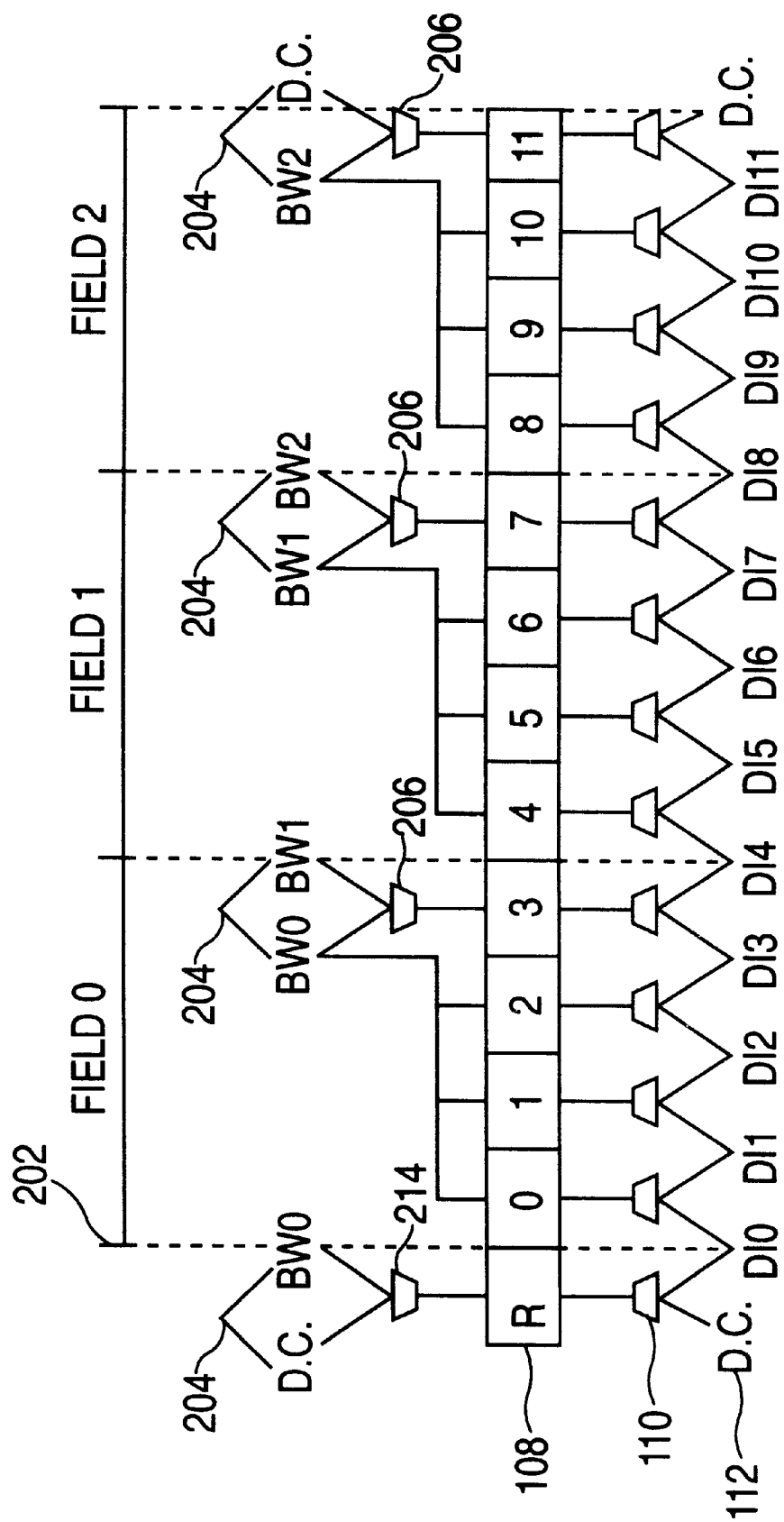
FIG. 2 depicts an alternate exemplary embodiment of the circuitry of the present invention.

FIG. 2 depicts an alternate exemplary embodiment of the present invention using a four bit BW multi-bit field control signal as an example. It performs the same functions as the circuitry described in reference to FIG. 1 but eliminates field control signal multiplexors 106 where both control signal inputs 104 to the multiplexor 106 are the same. The circuitry depicted in FIG. 2 contains one field control signal multiplexor 206 for each field 202 or BW multi-bit control signal. This is possible because when the BW multi-bit control signal is broken up into single BW data control signals, each data bit within a field 202 receives the same BW individual data bit control signal 204. Only the data bits at the boundaries of each field 202 must be adjusted in order to shift each data bit over one position if a defective data bit is detected. The number of field control signal multiplexors 206 can be reduced to one per field control signal plus one spare control signal multiplexor 214 to activate the redundant or spare data column 108 denoted as "R." The result is reduced circuitry. This exemplary embodiment can be expanded to any number of fields, to fields of any length, and to control signals that span multiple data bits. In addition, the present invention can be used to reduce circuitry in other circuit elements including arrays containing logic combinations.

Figure 3:
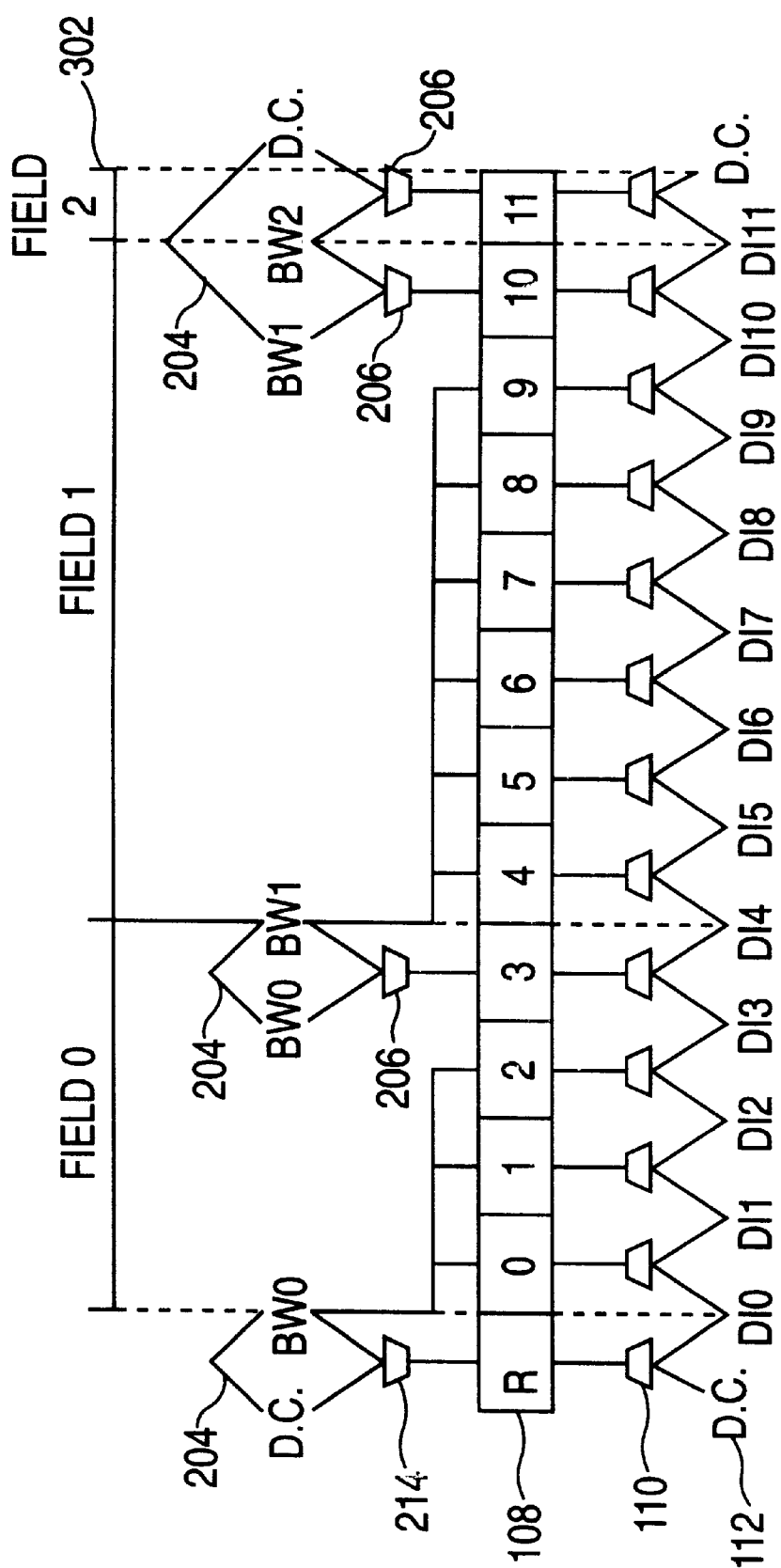
FIG. 3 depicts an exemplary embodiment of the circuitry of the present invention for implementing variable length fields.

FIG. 3 depicts an exemplary embodiment of the present invention that can be utilized with control signal fields 302 of varying lengths. In this embodiment, there are two BW multi-bit field control signals: BW0 with a field length of four and BW1 with a field length of seven; and a one-bit BW control signal, BW2, with a field length of one. The BW multi-bit field control signals 302 are separated into individual BW data bit control signals 204. Individual control signals 204, including the individual BW control signals and the D.C. control signals, are input into the field control signal multiplexors 206 and the spare control signal multiplexor 214 or they are input directly into the data bit columns in the array of data bits 108 as depicted in FIG. 3. FIG. 3 also depicts data input multiplexors 110 and data input values 112 going into the data input multiplexors 110. This exemplary embodiment can be expanded to any control signals that span multiple or single bits. The ability to handle variable length fields allows the present invention to be used to optimize a computer chip for a particular programming language or architecture.

FIG. 4a is a block diagram depicting an exemplary array or circuit and exemplary input values before a defective data bit has been detected. In an exemplary embodiment based on the circuitry depicted in FIG. 2, the circuitry and inputs could look like those depicted in FIG. 4a prior to testing the integrated circuit. FIG. 4a includes three BW multi-bit control signals (BW0, BW1, BW2) of field length four and one spare data bit ("R"). The spare data bit is not used when the circuitry is first created and the D.C. control signal is input to the spare data bit. The control signal multiplexors 206 214 result in the BW data bit control signal values denoted as 402 in FIG. 4. The circuitry also includes the individual BW data bit control signals 404 that do not vary based on multiplexor input values. Also depicted in FIG. 4a are the data input multiplexor 110 selections 406 that would be in place before the integrated circuit has been tested.

FIG. 4b is a block diagram depicting an exemplary circuit and input values after a data bit error has been detected and steered around. FIG. 4b depicts an exemplary embodiment of the resulting circuitry and inputs if the data bit in cell "6" was determined to be faulty and then steered around. All bits prior to the faulty bit are shifted one data cell over to the left. The control signal multiplexors 206 214 are redirected to produce the BW control signals denoted as 410. This causes the spare bit, denoted as "R", in the column of array of data bits 408 to be activated by the BW0 control signal along with the cells denoted "0", "1" and "2" in the array of data bits 408. At the same time the data multiplexors 110 are reset to move the corresponding data input values 412 over one column to the left in the column of array of data bits 408. As depicted in FIG. 4b all individual BW data bit control signals 402 404 and data input values 406 occurring after the faulty data bit cell, cell "6" in this example, are left in their original state and not redirected. This exemplary embodiment could be modified to support any cell in the array of data bits 408 being faulty.

The present invention allows for the manufacture of semiconductor computer chips with less circuitry while still providing the ability to recover from a failing data cell detected during computer chip testing. Splitting up multi-bit control signals into individual data bit control signals makes it possible to perform error recovery with one spare bit and fewer multiplexors. The ability to break a multi-bit control signal into individual data bit control signals also makes it possible to support multi-bit control signals of variable length within the same array while still providing for error recovery with one spare bit.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof Therefore, it is intended that the invention not be limited to the particular embodiments for carrying out this invention, but that the invention will include all embodiments falling within the scope of the appended claims.

What is claimed is:

1. A system for implementing a column redundancy scheme for arrays with controls that span multiple data bits, said system comprising:

an array of data bits for receiving data inputs;

a spare data bit;

a field control input line;

circuitry to separate a field control signal from said field control input line into one or more individual control signals for activating a corresponding data bit in said array or for input into a multiplexor;

circuitry to steer around a defective data bit in said array including:

a field control signal multiplexor corresponding to each said field control signal;

a spare control signal multiplexor to activate said spare data bit;

a data multiplexor corresponding to each said data bit in said array; and a spare data multiplexor to steer one of said data inputs to said spare data bit; and programmable logic in communication with said field control signal multiplexor, said spare control signal multiplexor, said data multiplexor and said spare data multiplexor to cause said steer around to take place in response to detecting a defective data bit in said array of data bits.

2. The system of claim 1 wherein said field control signal multiplexor input includes two of said individual control signals, or one of said individual control signals and a constant control signal; and wherein said field control signal multiplexor output includes activating one bit in said array of data bits.

3. The system of claim 1 wherein said spare control signal multiplexor input includes one of said individual control signals and a constant control signal and wherein said spare control signal multiplexor output includes activating said spare data bit.

4. The system of claim 1 wherein said data multiplexor input includes two of said data inputs, or a constant data signal and one said data input; and wherein said data multiplexor output is input to one bit of said array of data bits.

5. The system of claim 1 wherein said spare data multiplexor input includes a constant data signal and one said data input, and wherein said spare data multiplexor output is input to said spare data bit in said array.

6. The system of claim 1 wherein said field control input line includes a plurality of said field control signals.

7. The system of claim 6 wherein said plurality of said field control signals include field controls signals of varying lengths.

8. A system for implementing a column redundancy scheme for arrays with controls that span multiple data columns, said system comprising:

an array of data columns for receiving data inputs;

a spare data column;

a field control input line;

circuitry to separate a field control signal from said field control input line into one or more individual control signals for activating a corresponding data column in said array or for input into a multiplexor;

circuitry to steer around a defective data column in said array including:

a field control signal multiplexor corresponding to each said field control signal;

a spare control signal multiplexor to activate said spare data column;

a data multiplexor corresponding to each said data column in said array; and a spare data multiplexor to steer one of said data inputs to said spare data column; and programmable logic in communication with said field control signal multiplexor, said spare control signal multiplexor, said data multiplexor and said spare data multiplexor to cause said steer around to take place in response to detecting a defective data column in said array.

9. A system for implementing a column redundancy scheme for arrays with controls that span multiple data columns, said system comprising:

an array of data columns arranged sequentially and grouped together by control field group, wherein each said data column is activated in response to a corresponding column control signal line, each said array including a first control field group and a last control field group and each said control field group including a last column;

a spare data column, wherein said spare data column is activated in response to a spare column control signal line;

a field control signal line for each said control field group, wherein said field control signal line is input to said corresponding column control signal line for all but said last column in each said control field group;

a constant control signal line;

a control field multiplexor corresponding to each said control field group including as input said corresponding field control signal line and said corresponding field control signal line for said next sequential control field group, or said constant control signal line and said corresponding field control signal line if said control field group is said last control field group, and including as output said column control signal line corresponding to said last column in said control field group;

a spare control column multiplexor including as input said field control signal line corresponding to said first control field group and said constant control signal line and including as output said spare column control signal line; and a programmable element associated with each said control field multiplexor and said spare control column multiplexor to alter the output of said multiplexor to steer around a defective column in response to said array of data columns including a defective column.

* * * * *